United States Patent [19]

Jensen

[11] Patent Number: 5,677,561
[45] Date of Patent: Oct. 14, 1997

[54] TEMPERATURE COMPENSATED LOGARITHMIC DETECTOR

[75] Inventor: Brent R. Jensen, Portland, Oreg.

[73] Assignee: Maxim Integrated Products, Inc., Sunnyvale, Calif.

[21] Appl. No.: 599,093

[22] Filed: Feb. 7, 1996

Related U.S. Application Data

[63] Continuation-in-part of Ser. No. 581,033, Dec. 29, 1995.
[51] Int. Cl.$^6$ .................................................. H01L 31/058
[52] U.S. Cl. .................. 257/469; 330/256; 330/261; 330/300; 327/350; 327/351; 327/408; 327/512
[58] Field of Search ........................... 257/469, 470; 330/256, 261, 272, 273, 278, 297, 300; 327/83, 350, 381, 405, 512

[56] References Cited

U.S. PATENT DOCUMENTS

| | | | |
|---|---|---|---|
| 4,604,532 | 8/1986 | Gilbert | 307/490 |
| 4,929,909 | 5/1990 | Gilbert | 330/256 |
| 4,990,803 | 2/1991 | Gilbert | 307/492 |
| 5,298,811 | 3/1994 | Gilbert | 307/492 |
| 5,345,185 | 9/1994 | Gilbert | 328/145 |

Primary Examiner—Ngân V. Ngô
Attorney, Agent, or Firm—Hickman Beyer & Weaver

[57] ABSTRACT

A temperature compensated logarithmic detector biased with a proportional to absolute temperature (PTAT) voltage produced in accordance with an area ratio of biasing transistors is disclosed. According to one implementation of the invention, the temperature compensated logarithmic detector includes biasing circuitry and a logarithmic detector cell. The biasing circuitry receives an input signal and produces a PTAT bias voltage from the input signal. The PTAT characteristic of the PTAT bias voltage is produced by an area ratio. The logarithmic detector cell converts the input signal to a logarithmic output signal in accordance with a logarithmic transfer function over a narrow range.

27 Claims, 10 Drawing Sheets

TEMPERATURE COMPENSATED LOGARITHMIC DETECTOR

CROSS-REFERENCE TO RELATED APPLICATION

This application is a continuation-in-part of U.S. patent application Ser. No. 08/581,033, filed Dec. 29, 1995, naming Brent R. Jensen and James W. H. Marsh as inventors, and assigned to the assignee of the present application, which is hereby incorporated by reference.

BACKGROUND OF THE INVENTION

1. Field of the Invention

The present invention relates to logarithmic circuits and, more particularly, to logarithmic detectors or amplifiers.

2. Description of the Related Art

Logarithmic detectors or amplifiers are particularly useful in situations where signals of a large dynamic range are encountered. Thus, logarithmic detectors or amplifiers are useful, for example, in applications requiring compression of a wide range analog input data and linearization of transducers having exponential outputs. The precision and stability of the logarithmic transfer function of a logarithmic detector or amplifier is important and should be independent of both temperature and process variations. It is especially important that the bias point of the logarithmic transfer function be insensitive to temperature variations.

In recent years, special design techniques have been developed so that the logarithmic transfer function of a logarithmic detector or amplifier is independent of both temperature and process variations. FIG. 1 is a block diagram of an example of a conventional temperature compensated full-wave detector 2. The full-wave detector 2 receives an input voltage ($V_{IN}$) and produces logarithmic output currents $I_{LOG+}$, $I_{LOG-}$. The full-wave detector 2 includes first and second emitter followers and a full-wave logarithmic detector cell. The first emitter follower includes a transistor Qa, a resistor R and a current source Ia, and operates to produce a first bias voltage across the resister R. The second emitter follower includes a transistor Qb, a resistor R and a current source Ib, and operates to produce a second bias voltage across the resister R. The first and second bias voltages are identical because the transistors Qa and Qb are identical, the resistors R are identical, and the current sources Ia and Ib are identical. The first and second bias voltages are also proportional to absolute temperature (PTAT) because the current sources Ia and Ib are made PTAT. The resulting PTAT bias voltages Vr [$Vr=I_{a,b}(R)$] are then supplied to the full-wave logarithmic detector cell. The full-wave logarithmic detector cell includes identical transistors Qc, Qd, Qe and Qf as well as identical current sources Ic and Id. The transistors Qc and Qd form a first transistor pair, and the transistors Qe and Qf form a second transistor pair. The bias voltage appears across the bases of the transistors making up the first and second transistor pairs. The logarithmic output current $I_{LOG+}$ is shown as being obtained from the commonly connected collectors of the transistors Qd and Qf and the logarithmic output current $I_{LOG-}$ is shown as being obtained from the commonly connected collectors of the transistors Qc and Qe. Conventional temperature compensated full-wave detectors such as illustrated in FIG. 1 are described, for example, in U.S. Pat. No. 4,990,803.

These special design techniques, however, are disadvantageous for low-power circuit designs because the die area required to fabricate the resistors used to bias the transistors of the logarithmic detector cell is relatively large. As a result, the cost of manufacture is increased because die area is a major cost component of fabricated circuits. Also, with low-current operation, these large value resistors degrade high frequency performance. Although corrections can be made to improve the high frequency performance, such corrections require additional die area. Thus, there is a need to bias the transistors of a logarithmic detector cell with a minimal amount of die area, without hindering temperature compensation or high frequency operation, and while using minimal power consumption.

SUMMARY OF THE INVENTION

Broadly speaking, the invention relates to a logarithmic detector that is biased with a proportional to absolute temperature (PTAT) voltage produced in accordance with an area ratio of biasing transistors. The invention can be implemented in numerous ways. Several implementations of the invention are detailed below.

A temperature compensated logarithmic detector according to an implementation of the invention includes biasing circuitry and a logarithmic detector cell. The biasing circuitry receives an input signal and produces a PTAT bias voltage. The PTAT characteristic of the bias voltage is produced using an area ratio which is greater than one. The logarithmic detector cell converts the input signal to a logarithmic output signal in accordance with a logarithmic transfer function. The logarithmic detector cell can be designed as either a half-wave detector cell or a full-wave detector cell.

A temperature compensated logarithmic detector according to another implementation of the invention, includes: a input terminal for receiving a differential input voltage, the input terminal having a first polarity side and a second polarity side; a first transistor with a first area, the first transistor having a base connected to the second polarity side, a collector connected to a first potential, and an emitter; a second transistor with a second area, the second transistor having a base connected to the first polarity side, a collector connected to the first potential, and an emitter; a first current source connected between the emitter of the first transistor and a second potential; a second current source connected between the emitter of the second transistor and the second potential; a third transistor having a base connected to the emitter of the second transistor, a collector, and an emitter; a fourth transistor having a base connected to the emitter of the first transistor, a collector, and an emitter connected to the emitter of the third transistor; a fifth current source connected between the commonly connected emitters of the third and fourth transistors and the second potential; and an output terminal for outputting a logarithmic signal, the output terminal being connected to at least one of the collectors of the third and fourth transistors.

Preferably, the first and second current sources are substantially identical, and the third transistor has a third area and the fourth transistor has a fourth area which differs from the third area. It is also preferred that a bias voltage be produced between the emitters of the third and fourth transistors in accordance with the area ratio of the third area to the fourth area and between the emitters of the first and second transistors in accordance with the ratio of the first area to the second area. Additionally, the logarithmic detector may include a differential amplifier having a differential input connected across the emitters of the first and third transistors or across the differential input voltage.

As a method for temperature compensating a logarithmic detector having at least biasing circuitry and a logarithmic detector cell, an implementation of the invention includes the operations of: producing a bias voltage for biasing the logarithmic detector cell using a difference between base-emitter voltages of transistors; biasing certain transistors within the logarithmic detector cell in accordance with the bias voltage; receiving an input signal for logarithmic conversion; and logarithmicly converting the input signal to a logarithmic output signal using the biasing circuitry and the logarithmic detector cell. The bias voltage is proportional to absolute temperature (PTAT) due to the PTAT characteristics of the base-emitter voltages.

The invention is advantageous because less die area is required to fabricate a logarithmic detector operating at low current, primarily because the resistor values conventionally required to bias the transistors of the logarithmic detector cell (which take up a relatively large amount of die area) are no longer needed. As a result, the cost of manufacture is decreased because less die area is needed. Also, using different area ratios inherently provides highly accurate PTAT voltages without sophisticated bias circuitry. Hence, according to the invention, the transistors of a logarithmic detector cell are able to be biased with a minimal amount of die area, yet temperature compensation or high frequency operation is not hindered. The invention can also use minimal power which makes the invention suitable for low-power designs such as battery driven applications.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 2A–10. However, those skilled in the art will readily appreciate that the detailed description given herein with respect to these figures is for explanatory purposes as the invention extends beyond these limited embodiments.

Figure 2A:
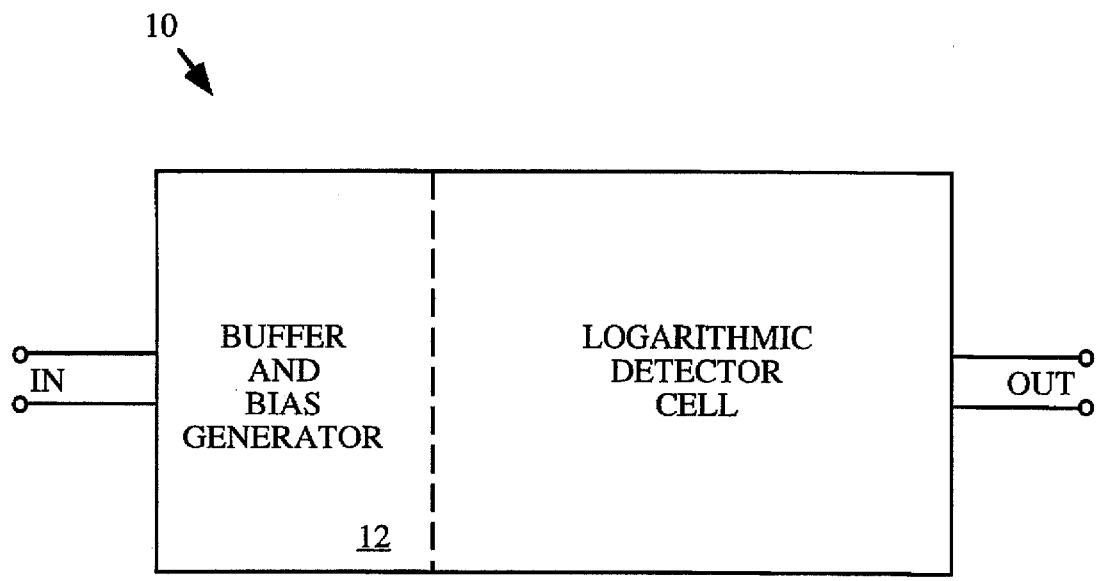
FIG. 2A is a block diagram of a temperature compensated logarithmic detector according to a first embodiment of the invention.

FIG. 2A is a block diagram of a temperature compensated logarithmic detector 10 according to a first embodiment of the invention. The logarithmic detector 10 includes buffer and bias generator 12 and a logarithmic detector cell 14. The detector cell 14 can be either a half-wave detector cell including a single differential transistor pair or a full-wave detector cell including two coupled differential transistor pairs. The buffer and bias generator 12 operates to buffer an input voltage and produce a bias voltage to bias the differential transistor pair(s) within the logarithmic detector 10. The bias voltage is designed to be PTAT in order to cancel the inherent temperature dependence of the transistors making up the detector cell 14. Hence, the bias state of the logarithmic detector 10 is inherently independent of temperature variations.

Figure 2B:
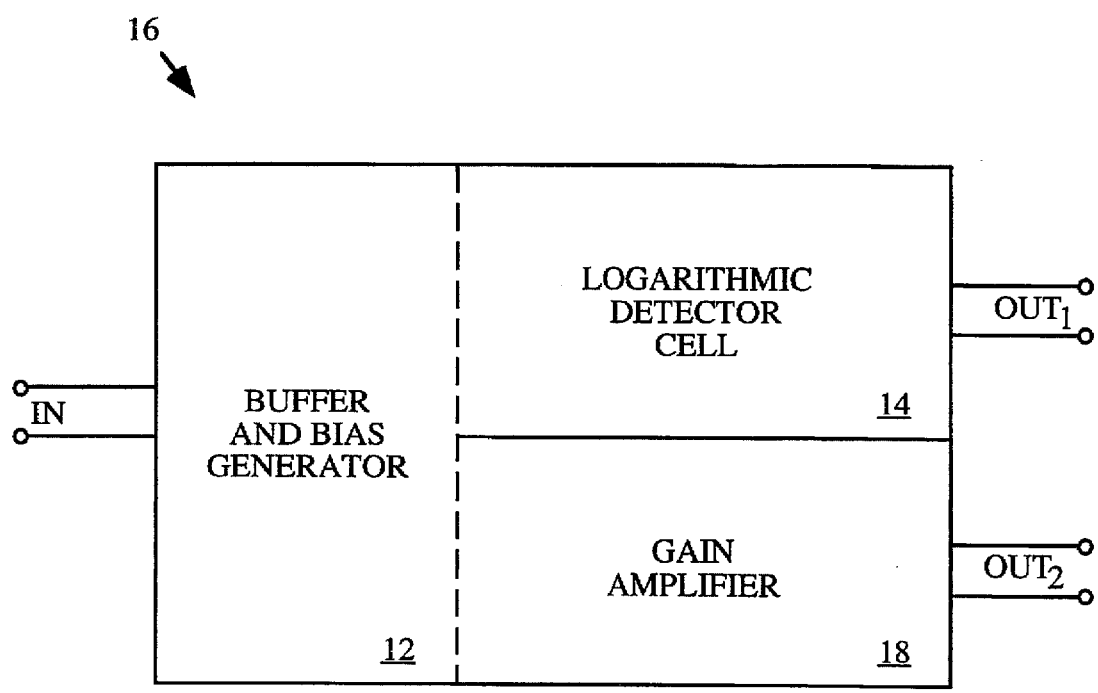
FIG. 2B is a block diagram of a temperature compensated logarithmic detector according to a second embodiment of the invention.
Figure 5:
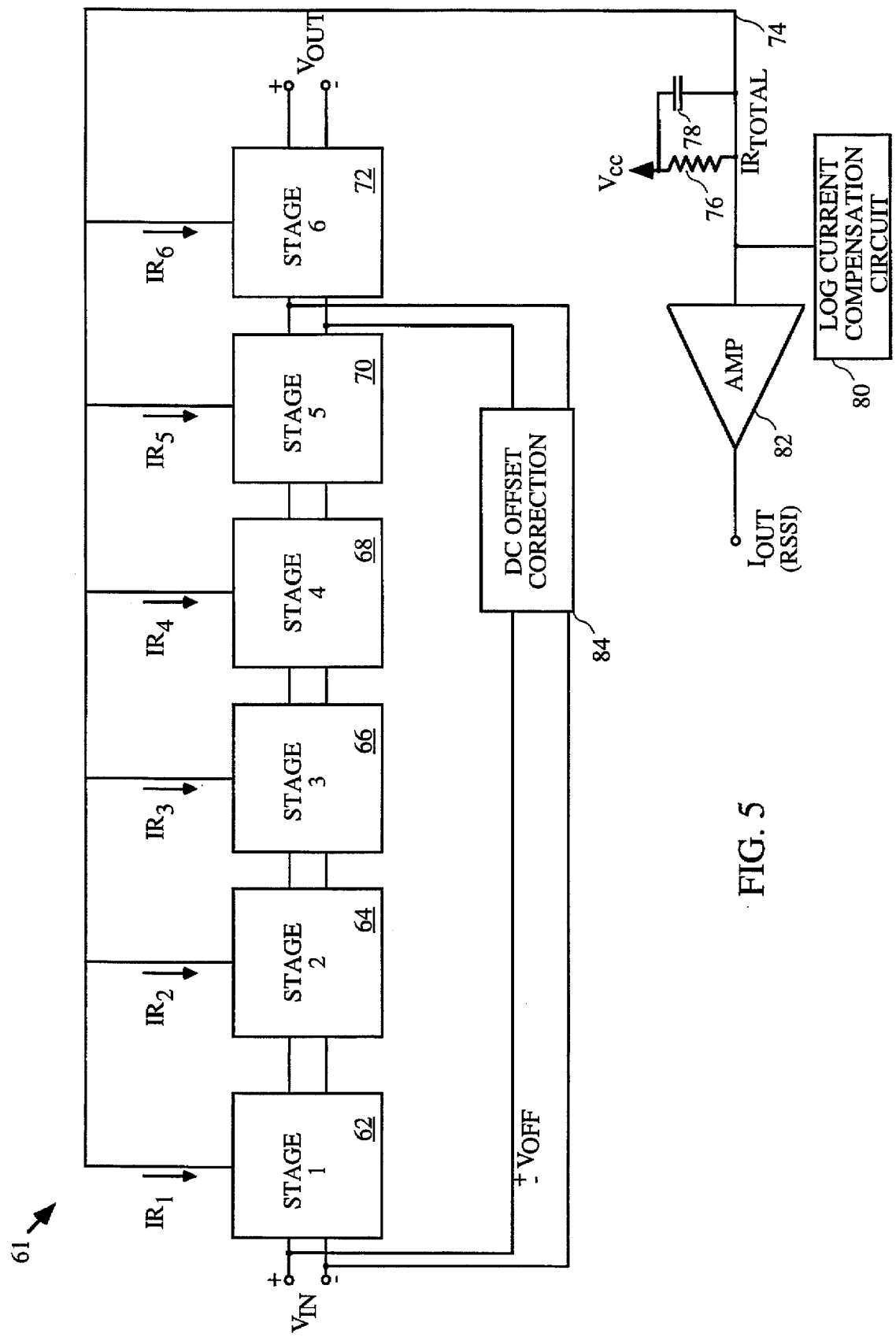
FIG. 5 is a block diagram of a six-stage log amplifier/limiter using full-wave detector cells.

FIG. 2B is a block diagram of a temperature compensated logarithmic detector 16 according to a second embodiment of the invention. The logarithmic detector 16 includes the buffer and bias generator 12 as well as the logarithmic detector cell 14 which are the same as in the first embodiment. In addition, the logarithmic detector 16 includes a gain amplifier 18. The gain amplifier 18 operates to amplify the input voltage. The gain amplifier 18 is preferably formed from a differential amplifier and is also biased by the buffer and bias generator 12. Additionally, the gain amplifier 18 also uses a PTAT current source for temperature compensated amplification. Accordingly, the gain amplifier 18 amplifies the input voltage with a gain that is constant despite temperature changes. The second embodiment of the invention is, for example, used in a wide dynamic range, high-speed logarithmic amplifier design built from cascaded detector stages such as illustrated in FIG. 5.

Figure 3:
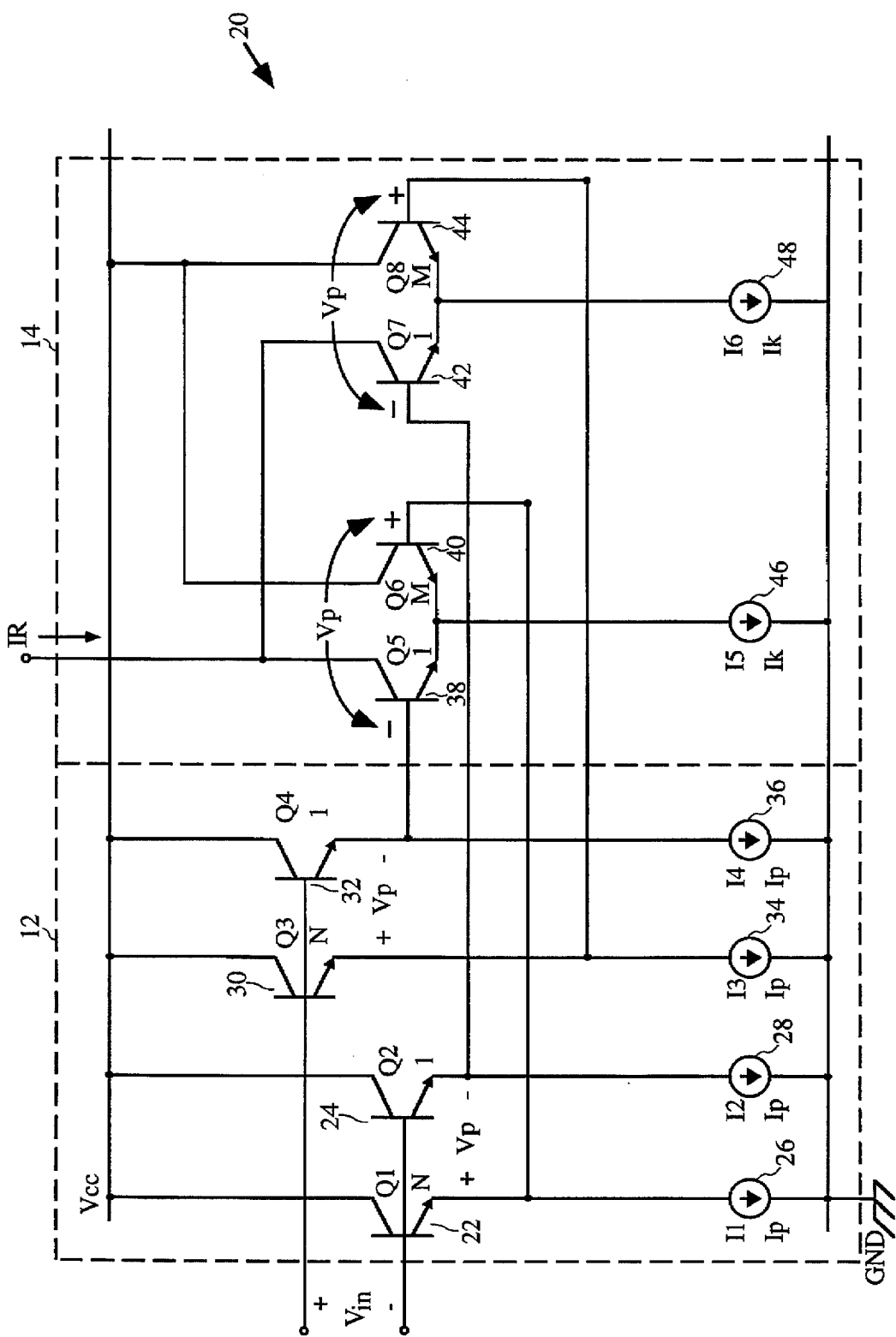
FIG. 3 is a schematic diagram of a temperature compensated full-wave detector according to the invention.

FIG. 3 is a schematic diagram of a temperature compensated full-wave detector 20 according to the invention. The full-wave detector 20 illustrated in FIG. 3 is an exemplary detailed diagram of the full-wave detector 10 according to the first embodiment of the invention (FIG. 2A).

The full-wave detector 20 receives an input voltage ($V_{IN}$) and outputs a logarithmic current (IR). The full-wave detector 20 includes first and second bipolar transistors 22 and 24 (Q1 and Q2). The base of the first and second bipolar transistors 22 and 24 (Q1 and Q2) is coupled to the negative side of the input voltage ($V_{IN}$), the collectors are coupled to $V_{CC}$, and the emitters are respectively coupled to ground (GND) via current sources 26 and 28 (I1 and I2). The full-wave detector 20 also includes third and fourth bipolar transistor 30 and 32 (Q3 and Q4). The bases of the third and fourth bipolar transistors 30 and 32 (Q3 and Q4) are coupled to the positive s side of the input voltage ($V_{IN}$), the collectors are coupled to $V_{CC}$, and the emitters are respectively coupled to ground (GND) via current sources 34 and 36 (I3 and I4). The transistors 22, 24, 30 and 32 together with the current sources 26, 28, 34 and 36 are associated with the buffer and bias generator 12 of FIGS. 2A and 2B. Each of the transistors 22, 24, 30 and 32 together with its corresponding current source 26, 28, 34 and 36 form an emitter follower.

Figure 1:
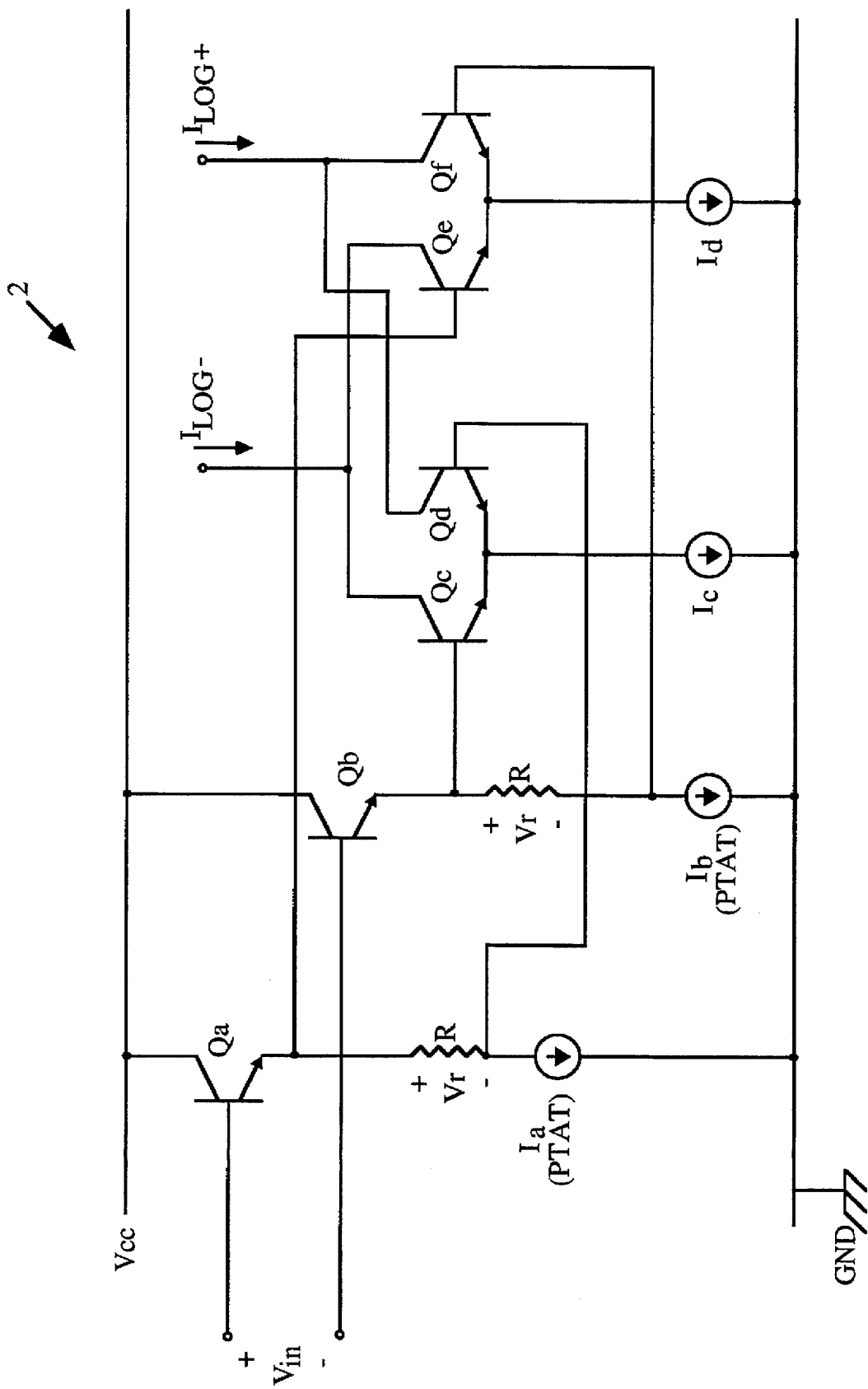
FIG. 1 is a schematic diagram of an example of a conventional temperature compensated full-wave detector.

The full-wave detector 20 also includes fifth and sixth transistors 38 and 40 (Q5 and Q6) and seventh and eighth transistors 42 and 44 (Q7 and Q8). The fifth and sixth transistors 38 and 40 (Q5 and Q6) rectify positive input transitions of the input voltage ($V_{IN}$) and the seventh and eighth transistors 42 and 44 (Q7 and Q8) rectify negative input transitions of the input voltage ($V_{IN}$). The fifth and sixth transistors 38 and 40 (Q5 and Q6) form a first transistor pair, and the seventh and eighth transistors 42 and 44 (Q7 and Q8) form a second transistor pair. The base of the fifth transistor 38 (Q8) is coupled to the emitter of the fourth transistor 32 (Q4). The base of the sixth transistor 40 (Q6) is coupled to the emitter of the first transistor 22 (Q1). The emitters of the fifth and sixth transistors 38 and 40 (Q5 and Q6) are connected together. The base of the seventh transistor 42 (Q7) is coupled to the emitter of the second transistor 24 (Q2). The base of the eighth transistor 44 (Q8) is coupled to the emitter of the third transistor 30 (Q3). The emitters of the seventh and eighth transistors 42 and 44 (Q7 and Q8) are connected together. The collectors of the sixth transistor (Q6) 40 and the eighth transistor (Q8) 44 are connected together and to $V_{CC}$. The collectors of the fifth transistor (Q5) 38 and the seventh transistor (Q7) 42 are connected together. The output of the full-wave detector 20, the logarithmic current (IR), is obtained from the commonly connected collectors of the fifth and seventh transistors (Q5 and Q7) 38 and 42. The transistors 38, 40, 42 and 44 and the current sources 46 and 48 are associated with the logarithmic detector cell 14 of FIGS. 2A and 2B. The conventional approach to providing a PTAT bias voltage is to produce the voltage across a resistor using a PTAT current source. See, e.g., FIG. 1 and U.S. Pat. No. 4,990,803. In contrast, instead of using resistors to provide a PTAT bias voltage as conventionally done, the full-wave detector 20 according to the invention s alters the relative areas for the transistors within the full-wave detector 20 (at least the portion corresponding to the buffer and bias generator 12) to provide the PTAT bias voltage. The resulting PTAT voltage produced by relative area ratio causes the biasing of the full-wave detector 20 to be independent of temperature as explained in more detail below.

For proper operation as a temperature compensated detector cell 14, the transistors Q5–Q8 must be biased such that the ratio of collector current between the differential transistor pairs Q5, Q6 and Q7, Q8 remains a fixed fraction of the total current available when $V_{IN}=0$. The total current available is Ik (current sources 15 and 16). Hence, for the differential transistor pair Q5, Q6, a first portion (IC5) of the total current Ik flows through the transistor Q5 and a second portion (IC6) of the total current Ik flows through the transistor Q6. The sum of the first and second portions is the total current Ik. These ratios are typically set between 10:1 to 30:1, which provide adequate detector output current range.

With $V_{IN}=0$, setting the current through the differential transistor pairs Q5, Q6 and Q7, Q8 to be a constant ratio verses temperature is of primary importance. To keep the ratio of the collector current fixed, a bias voltage for the transistors Q5–Q8 of the detector cell 14 must be proportional to absolute temperature (PTAT) to cancel out the inherent temperature dependence of the bipolar transistors Q5–Q8. The ratio of the collector current between the differential transistor pairs Q5, Q6 and Q7, Q8 is mathematically expressed by Equation 1 which follows.

$$IC6/IC5=IC8/IC7=M \exp(Vp/Vt) \quad (V_{IN}=0) \quad \text{(Eq. 1)}$$

where Vp is a bias voltage for the transistor pairs Q5, Q6 and Q7, Q8; IC5, IC6, IC7 and IC8 are collector currents through respective transistors Q5, Q6, Q7 and Q8; and Vt is the thermal voltage. The thermal voltage Vt=KT/q, where K is the Boltzmann's constant, T is absolute temperature, q is the elementary charge of an electron, and M is an area ratio of the transistor pairs Q5, Q6 and Q7, Q8. Thus, the ratio of the collector current is an exponential function which varies with temperature. For example, if a ratio of 10:1 were desired for the bias current, then the appropriate bias voltage would be 60 mV at room temperature (300 K) with M=1 or the appropriate bias voltage would be 31.3 mV at room temperature (300 K) with M=3.

Accordingly, to maintain the ratio of the bias current fixed over temperature, the bias voltage (Vp) is made to be proportional to absolute temperature (PTAT). The invention provides a novel approach to creating the PTAT bias voltage using an area ratio between emitter followers. The area ratio itself leads to a bias voltage that is inherently PTAT.

More particularly, the area ratio is discussed with respect to FIG. 3. The transistors Q 1, Q2, Q3 and Q4 are each connected in the full-wave detector 20 as emitter followers and operate to buffer the input voltage ($V_{IN}$). The transistors Q1, Q2, Q3 and Q4 are respectively biased by the current sources I1, I2, I3 and I4, which each supply the same amount of current Ip. It is important to note that the transistors Q1 and Q2 have a relative area ratio of N:1, and that transistors Q3 and Q4 have a relative area ratio of N:1. The value of N will vary with the particular application of the logarithmic full-wave detector. Typically, the value of N is chosen to be between 2 to 5. The value of N is normally an integer, but could also be a non-integer value. For example, with N=3, the area of the transistor Q1 is three (3) times that of the transistor Q2, and consequently, the collector current density through the transistor Q1 is three (3) times lower than the collector current density through the transistor Q2. With N=3, the transistor Q1 can easily be derived with an area three times that of the transistor Q2 by forming the transistor Q1 from three transistors of the size of the transistor Q2 connected in parallel, thereby providing excellent transistor matching.

In general, Vbe=Vt ln[IC/(A(Is))], where A represents a transistor area. Therefore, according to the invention, the bias voltage Vp produced by the emitter followers is expressed by Equation 2 below.

$$Vp=Vbe2-Vbe1=Vt\ \ln[Ip/Is]-Vt\ \ln[Ip/(N(Is))]$$

$$Vp=\Delta Vbe=Vt\ \ln(N) \quad \text{(Eq. 2)}$$

where ΔVbe is the difference in base-emitter voltages. With respect to FIG. 3, the base-emitter voltages are from the emitters of the transistors 22 and 24 (Q1 and Q2) or the emitters of the transistors 30 and 32 (Q3 and Q4). As shown in Equation 2, the s bias voltage Vp is proportional to the thermal voltage Vt, which is proportional to absolute temperature (PTAT). Therefore, the bias voltage Vp produced by the emitter followers is proportional to absolute temperature (PTAT) as is necessary to temperature compensate the differential transistor pairs Q5, Q6 and Q7, Q8 of the logarithmic full-wave detector 20. The bias voltage Vp is also independent of the bias current Ip supplied by the current sources I1–I4.

When $V_{IN}=0$, the PTAT bias voltage Vp appears between the emitters of Q1, Q4 as well as between the emitters of Q3, Q2. These bias voltages are used to bias the transistors Q5–Q8 in a complementary cross-coupled fashion to form the logarithmic detector 14. It is important to note that the transistors Q5 and Q6 have a relative area ratio of 1:M, and that transistors Q7 and Q8 have a relative area ratio of 1:M. These differential pairs Q5, Q6 and Q7, Q8 are respectively biased by the current sources I5 and I6, which each supply current Ik. For accurate logarithmic operation, the current Ik supplied by the current sources I5 and I6 should be constant with respect to temperature. The value of M will vary with the particular application of the logarithmic detector. Typically, the value of M is chosen to be between 2 to 5. For example, with M=3, the area of the transistor Q6 is three (3) times that of the transistor Q5. The value of M is normally an integer to simplify transistor matching, but could also be a non-integer value.

When $V_{IN}=0$ and with the PTAT voltage Vp provided by the emitter followers imposed across the differential transistors pairs Q5, Q6 and Q7, Q8, the logarithmic current (IR) produced by the full-wave logarithmic detector 20 (ignoring base currents) is expressed by Equation 3 below.

$$IR=IC5+IC7 \quad \text{(Eq. 3)}$$

Using Equations 1 together with the relationships Ik=IC5+IC6 and Ik=IC7+IC8, Equation 4 which follows can be derived from Equation 3.

$$IR=2(Iky)/(M \exp(Vp/Vt)+1) \quad \text{(Eq. 4)}$$

Substituting Equation 2 into Equation 4 and simplifying gives:

$$IR=2(Iky)/(M N+1) \text{ (for} V_{IN}=0) \quad \text{(Eq. 5)}$$

Thus, in accordance with the invention, the PTAT bias voltage Vp (which is derived from unequal area transistors biased with identical current sources) compensates for the temperature dependent biasing of the full-wave logarithmic detector cell 14. Equation 5 indicates that the resulting zero input bias current output (IR) from the logarithmic full-wave detector 20 is independent of temperature. The invention also gives circuit designers a great deal of flexibility in choosing values for M and N which can depend on the application. Typically, N=M=3 is a good choice because the bias ratio is exactly 10:1. Larger M and N values will yield larger current ratios, but high-speed operation suffers since transistors Q5 and Q7 are then biased with very low currents.

More generally, if $V_{IN}$ is included in the analysis, the resulting logarithmic current (IR) output from the logarithmic full-wave detector 20 is given below by Equation 6, but is first derived as follows.

Two loop equations can be written from the full-wave detector 20 shown in FIG. 3. These two loop equations will help determine how the logarithmic output current relates to the input voltage $V_{IN}$.

The first loop equation is:

$$V_{IN}=Vbe4+Vbe5-Vbe6-Vbe1$$

which, given that Vbe=Vt ln(IC/Is), can be written as follows $$V_{IN}=Vt \ln(Ip/Is)+Vt \ln(IC5/Is)-Vt \ln(IC6/Is)-Vt \ln(Ip/Is)$$

then $$V_{IN}/Vt=\ln(N)+\ln(M \text{ } IC5/IC6)$$

which can be rewritten as $$V_{IN}/Vt=\ln(NM \text{ } IC5/IC6)$$

Noting that Ik=IC5+IC6 while ignoring Beta, and solving the above equation for IC5 results in the following equation $$IC5=Ik/(1+MN \exp(-V_{IN}/Vt))$$

the second loop equation is:

$$V_{IN}=Vbe3+Vbe8-Vbe7-Vbe2$$

The above equation can be solved for IC7 since Ik=IC7+IC8. The resulting equation is then as follows.

$$IC7=Ik/(1+MN \exp(V_{IN}/Vt))$$

Then, since IR=IC5+IC7, IR can be expressed by Equation 6 which follows.

$$IR(Vin)=Ik/(1+MN \exp(-Vin/Vt)+Ik/(1+MN \exp(Vin/Vt)) \quad \text{(Eq. 6)}$$

Note that the first term of Equation 6 dominates the resulting logarithmic current (IR) when $V_{IN}$ is negative, and the second term of Equation 6 dominates the resulting logarithmic current (IR) when $V_{IN}$ is positive. Note that the resulting logarithmic current (IR) is a function of temperature when $V_{IN}$ is not equal to zero do to the thermal voltage Vt dependence. The temperature dependence of the resulting logarithmic current (IR) causes a lateral shift in the logarithmic current (IR) that can be compensated for after the detection operation.

By assuming that $V_{IN}>Vt$, then the term MN $\exp(V_{IN}/Vt)$ is significantly greater than 1, and the term MN $\exp(-V_{IN}/Vt)$ approaches zero, thus Equation 6 simplifies to:

$$IR(Vin)=Ik/(MN \exp(V_{IN}/Vt))=Ik \exp(-V_{IN}/Vt)/MN \quad \text{(Eq. 6a)}$$

which is valid when $V_{IN}>Vt$ (i.e., positive input polarity). Similarly, if $V_{IN}<-Vt$, then Equation 6 simplifies to:

$$IR(Vin)=Ik/(MN \exp(-V_{IN}/Vt))=Ik \exp(V_{IN}/Vt)/MN \quad \text{(Eq. 6b)}$$

Equations 6a and 6b illustrate that for input voltages greater than the magnitude of Vt, the full-wave detector 20 outputs a current (IR) that is proportional to the logarithm of the input signal ($V_{IN}$). It is because the full-wave detector 20 detects both positive and negative input polarities that the detector 20 can be described as a full-wave logarithmic detector.

Figure 4:
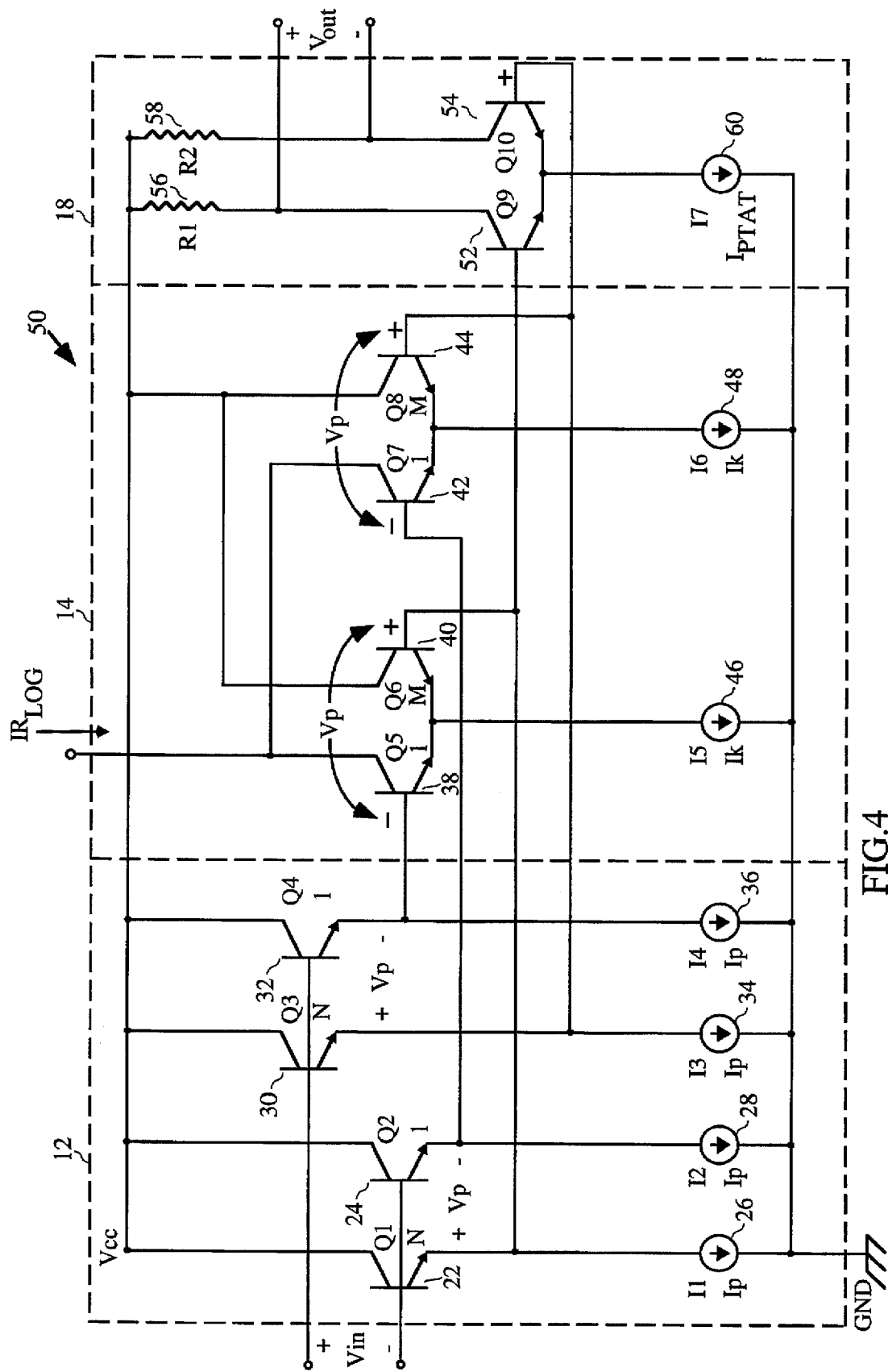
FIG. 4 is a schematic diagram of a temperature compensated full-wave detector having a gain amplifier according to the invention.

FIG. 4 is a schematic diagram of a temperature compensated full-wave detector 50 according to the invention. The full-wave detector 50 illustrated in FIG. 4 is an exemplary detailed diagram of the logarithmic detector 16 according to the second embodiment of the invention (FIG. 2B).

The full-wave detector 50 includes all the circuitry of the full-wave detector 20 illustrated in FIG. 3 as well as a gain amplifier. The gain amplifier includes a differential transistor pair 52 and 54 (Q9 and Q10), load resistors 56 and 58 (R1 and R2), and a PTAT current source 60 (17). The transistors 52 and 54 (Q9 and Q10) are preferably driven by the emitter followers having the larger area (N) (i.e., transistors Q1 and Q3)to reduce the input referred noise generated by the parasitic base resistance (larger transistors translates to smaller base resistance, and thus lower thermal noise).

The gain amplifier of the full-wave detector 50 linearly amplifies the input voltage $V_{IN}$ to produce an output voltage $V_{OUT}$. One full-wave detector cell has a nearly constant slope at its output as a function of input power (i.e., proportional to $V_{IN}^2$) over about a 2-to-1 range of input voltages. Hence, the logarithmic current (IR) output from the detector cell is logarithmicly linear over a range of about an octave. Hence, to extend the log-linear dynamic range, several full-wave detectors with amplifiers 16 can be cascaded together. In such a case, the output voltage of a previous stage is the input voltage to the next stage and the logarithmic current outputs (IR) of the various detector cells are summed together. Such a design results in a high gain, wide bandwidth limiting amplifier which includes a wide dynamic range, high-speed Receive Signal Strength Indicator (RSSI) function. The RSSI output voltage will be linear with respect to the input power. The gain per stage is typically set to be around 10-16 dB. Low gain is best for RSSI linearity (low ripple), and high gain is chosen for lower noise at the cost of increased ripple error in the RSSI output voltage.

FIG. 5 is a block diagram of a cascaded log amplifier/limiter 61 using six stages of full-wave detector cells. The log amplifier/limiter 61 uses a successive detection scheme to provide a high gain amplifier/limiter along with a wide dynamic range power detector (RSSI). A first stage 62 receives the input voltage $V_{IN}$ and outputs an output voltage and a logarithmic output current ($IR_1$). The second stage 64 receives the output voltage from the first stage 62 and outputs an output voltage and a logarithmic output current ($IR_2$). The third stage 66 receives the output voltage from the second stage 64 and outputs an output voltage and a logarithmic output current ($IR_3$). The fourth stage 68 receives the output voltage from the third stage 66 and s outputs an output voltage and a logarithmic output current ($IR_4$). The fifth stage 70 receives the output voltage from the fourth stage 68 and outputs an output voltage and a logarithmic output current ($IR_5$). The sixth stage 72 receives the output voltage from the fifth stage 70 and outputs an output voltage and a logarithmic output current ($IR_6$). The output voltage of the sixth stage 72 is the output voltage ($V_{OUT}$) of the six-stage log amplifier/limiter 61. The logarithmic output currents $IR_1$–$IR_6$ are summed into resister 76 at node 74 to produced a combined logarithmic current $IR_{TOTAL}$. The combined logarithmic current $IR_{TOTAL}$ is then filtered by capacitor 78. Then, the combined logarithmic current is adjusted by a log current compensation circuit 80 to compensate for the lateral shift in the output current $IR_{TOTAL}$ due to temperature. Hence, here the log current compensation circuit 80 compensates for the temperature dependence predicted in Equation 6. Such temperature compensation can be performed by summing a PTAT current into node 74. The PTAT temperature compensated current is then scaled by amplifier 82 to produce a final output current $I_{OUT}$ (or $V_{OUT}$), thereby ensuring that the final output current $I_{OUT}$ (or $V_{OUT}$) intercept remains constant with temperature over the log-linear dynamic range. A DC offset correction circuit 84 is also provided in this embodiment in an offset correction loop. Such offset correction is often required in DC coupled high gain designs to prevent the input offset from corrupting the proper DC bias state.

The detector (RSSI) slope accuracy is set by the temperature independent bias scheme described above, and by how accurate the constant current sources Ik are maintained over temperature. The RSSI output characteristics vary linearly with respect to the received input power (linear-in-dB) and can be designed to cover a dynamic range of as high as 80 dB on a single integrated circuit. For very high frequency operation, the practical dynamic ranges must be limited to around 40–50 db due to finite package isolation.

Accordingly, the invention enables full-wave detector cells to be biased in a simple and efficient manner. The biasing is achieved by generating a PTAT bias voltage using unequal area ratios of similar transistors. The advantages are that lower currents can be used without degrading high-frequency performance since the emitter followers directly drive the full-wave detector transistors, whereas conventionally large value resistors would be required with the low currents. The large value resisters conventionally required does, however, degrade high frequency performance. The conventional high frequency performance may be improved by adding high pass bypass capacitors in shunt across the resistors, but at the cost of additional die area.

Figure 6:
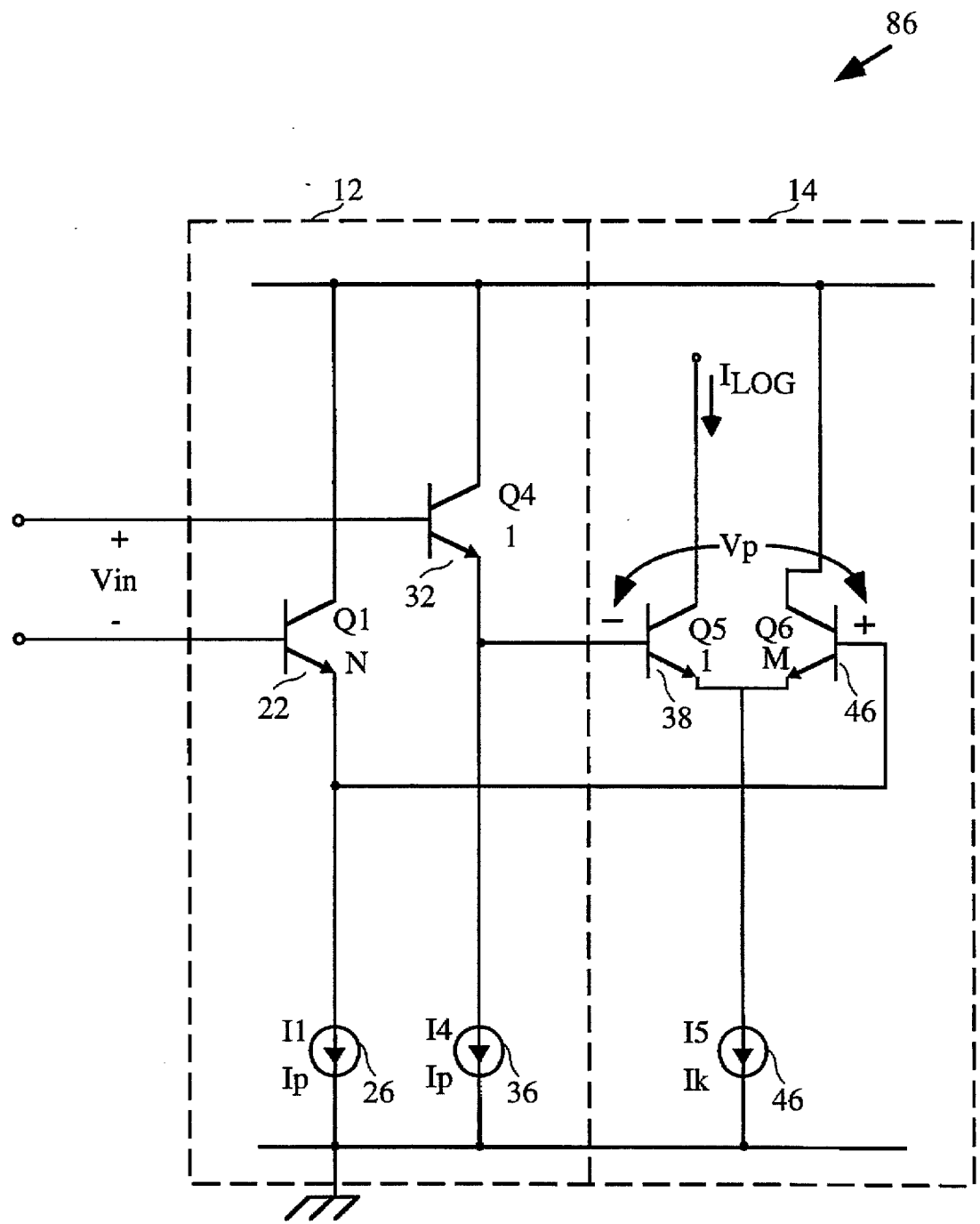
FIG. 6 is a schematic diagram of a temperature compensated half-wave detector according to the invention.

FIG. 6 is a schematic diagram of a temperature compensated half-wave detector 86 according to the invention. The design of the half-wave detector 86 is similar to the design of the full-wave detector 30 illustrated in FIG. 3. The differences relate to circuitry within the full-wave detector 20 that are not needed in the half-wave detector 86 which only rectifies one-half of the input signal. Apart from this difference, the operation of the half-wave detector 86 is the same as the operation of the full-wave detector 20. The bias voltage Vp is PTAT and is produced by an appropriate area ratio in accordance with the invention as discussed above.

FIGS. 7–10 are plots of the characteristics of a particular model of a full-wave detector according to the invention. The plots were generated using a SPICE-type simulator incorporating standard Gummel-Poon bipolar transistor models.

Figure 7:
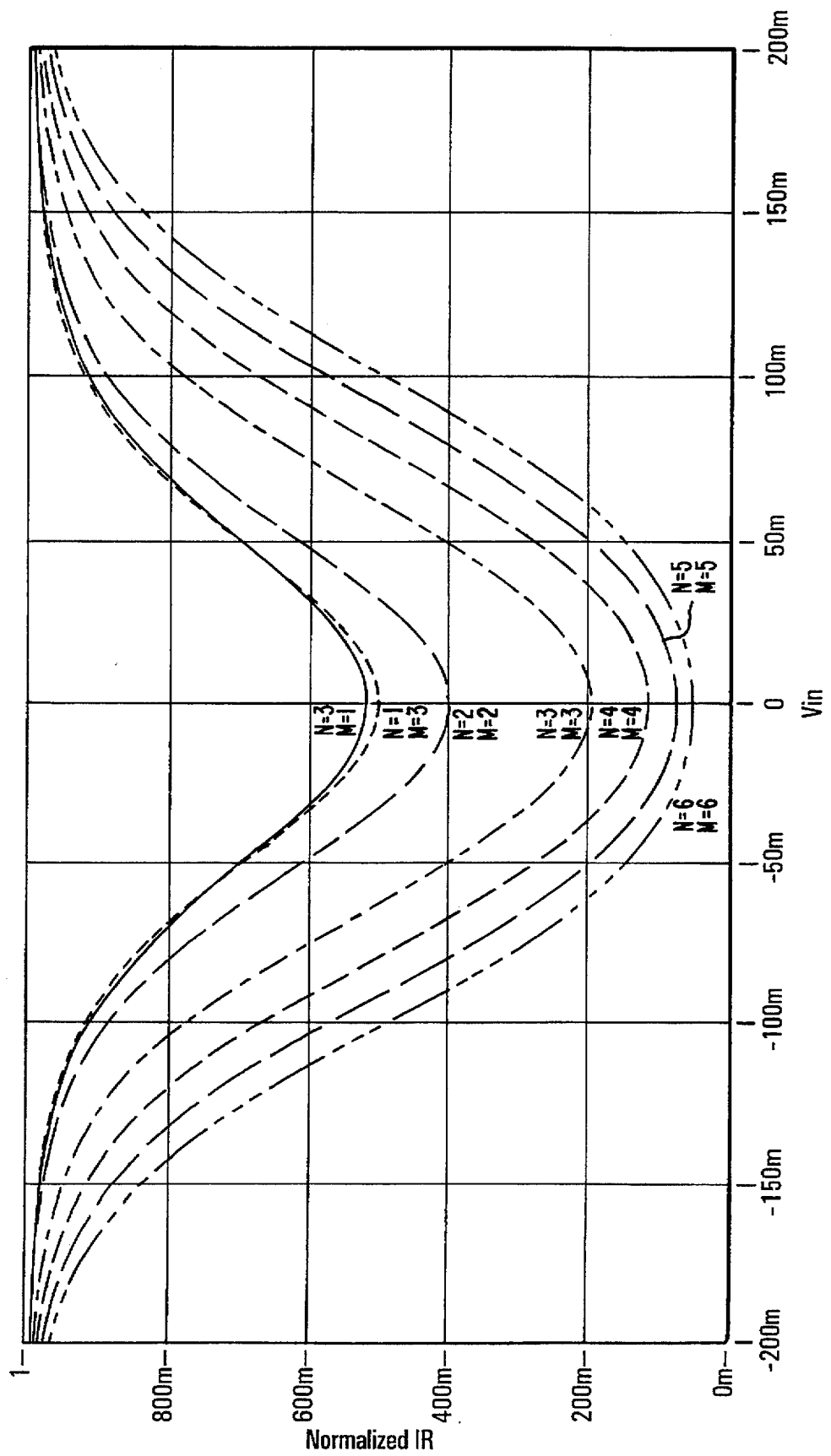
FIGS. 7–10 are plots of the characteristics of a particular model of full-wave detector according to the invention.

FIG. 7 is a plot of normalized output current (IR) verses magnitude of input voltage ($V_{IN}$) for various M and N values at a temperature of 25° C. FIG. 7 shows the positive and negative polarity output response to the input voltage of a full-wave logarithmic detector for various M and N values.

Figure 8:
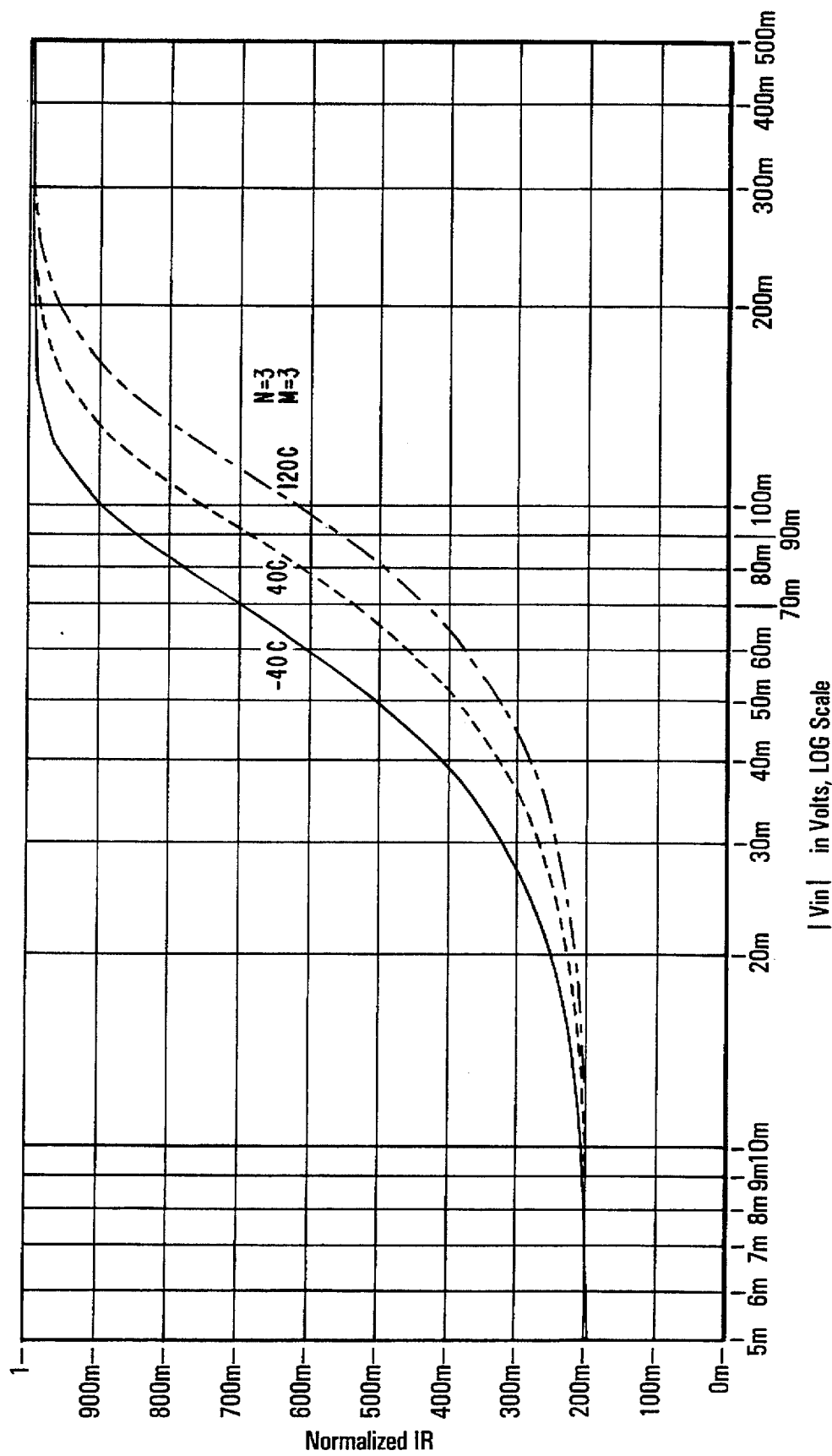

FIG. 8 is a plot of normalized output current (IR) verses input voltage ($V_{IN}$) and temperature with M=N=3 on a log scale. FIG. 8 shows a lateral shift in the normalized output current IR as a function of temperature as predicted by Equation 6. Note that for input voltages ($V_{IN}$) less than 5 mV (5 m on plot), the bias point is exactly temperature independent as predicted by Equation 5.

Figure 9:
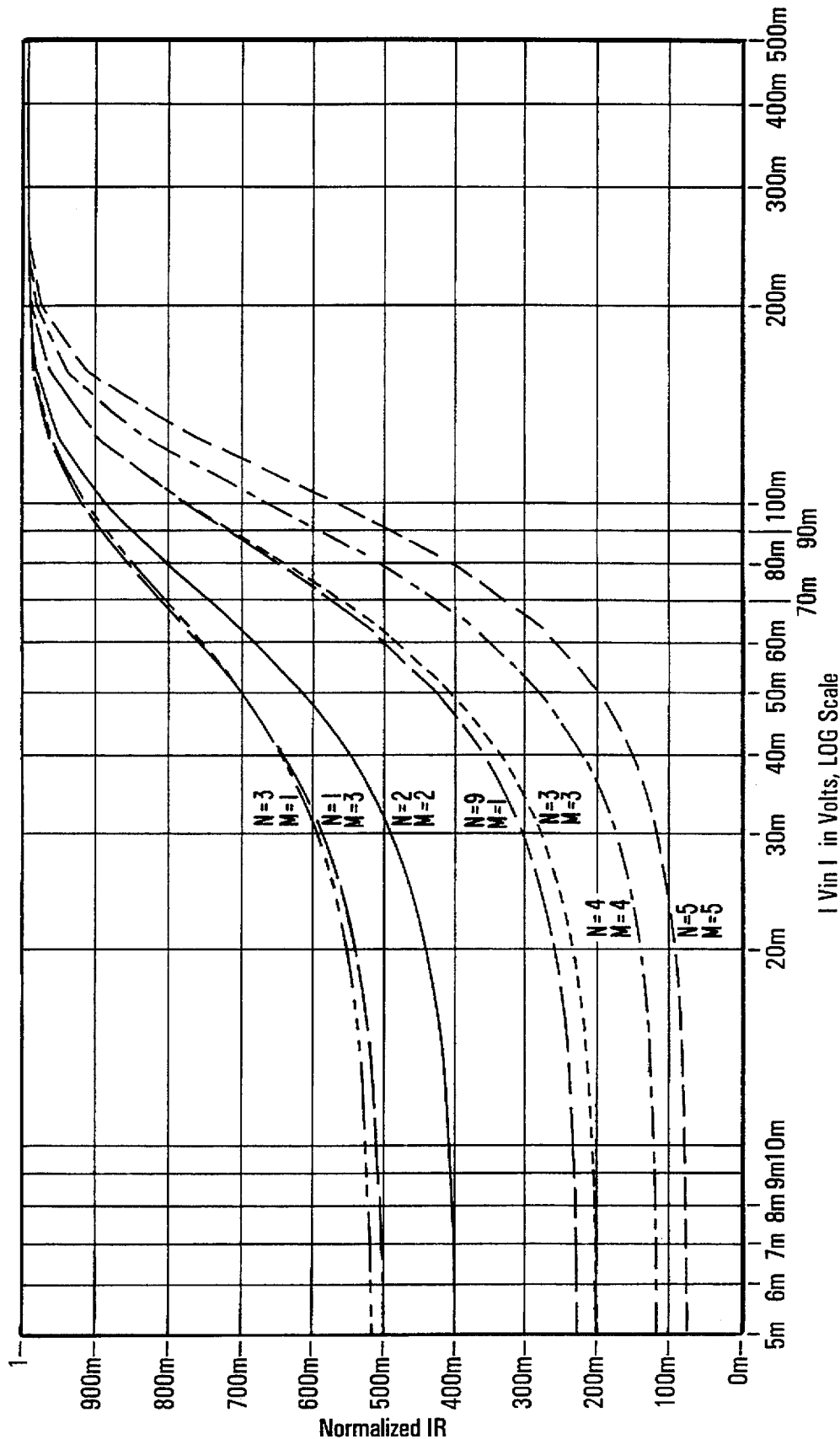

FIG. 9 is a plot of normalized output current (IR) verses magnitude of input voltage ($V_{IN}$) plotted on a LOG scale for various M and N values at a temperature of 25° C. FIG. 9 shows the linear range where the full-wave logarithmic detector is LOG-linear as well as the span of the normalized output current IR that occurs over this range for various M and N values.

Figure 10:
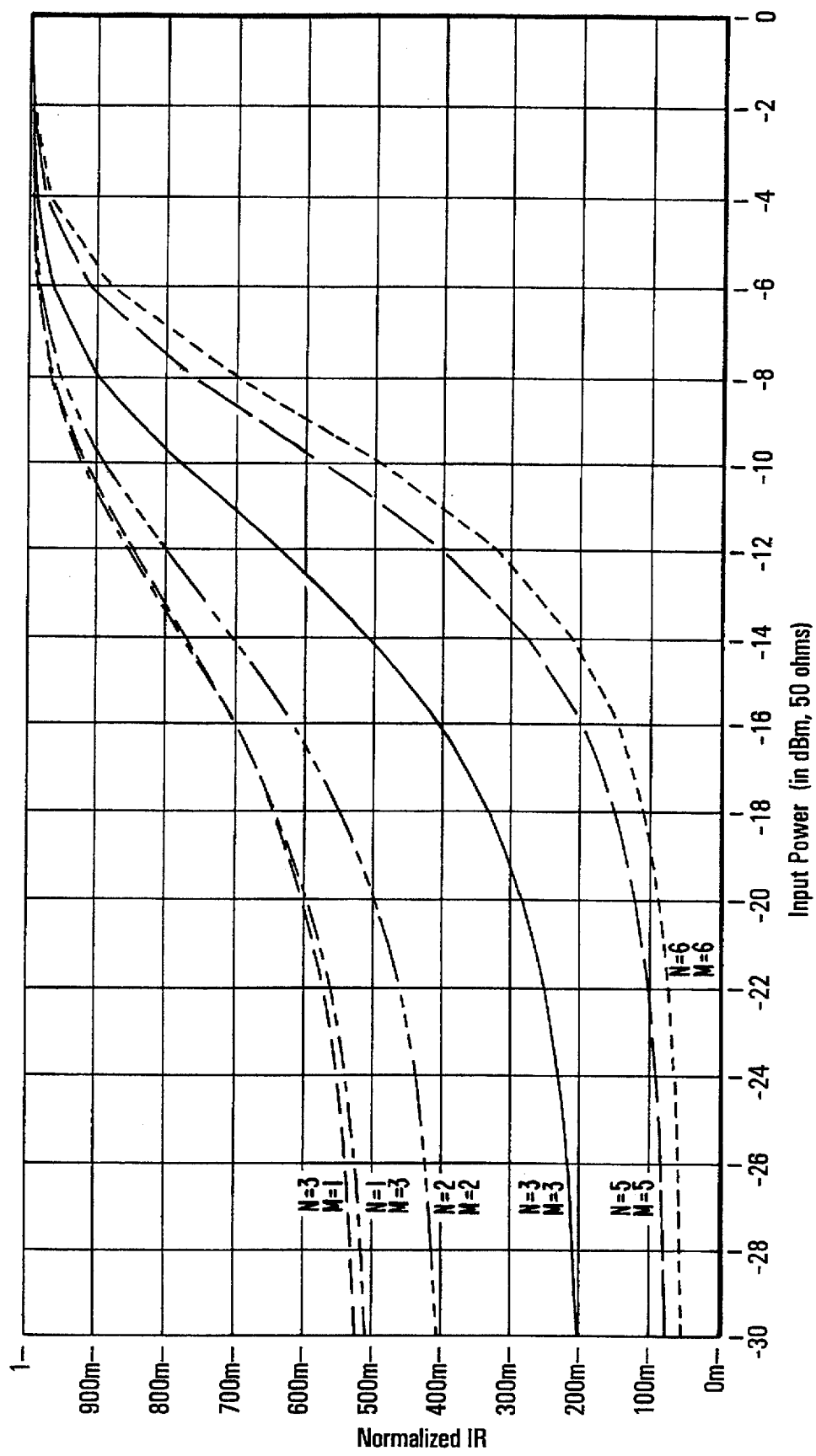

FIG. 10 is a plot of normalized output current (IR) verses input power (proportional to $V_{IN}^2$) for various M and N values at a temperature of 25° C. FIG. 10 shows the linear input power range where the full-wave logarithmic detector is Linear-in-dB as well as the span of the normalized output current IR that occurs over this range for various values of N and M. The input power is in units of dBm referred to 50 Ohms.

In the above described embodiments, the logarithmic output current ($I_{LOG}$) is taken from collectors of certain transistors within a logarithmic detector cell. In FIG. 3, the logarithmic output current ($I_{LOG}$) is obtained from the commonly connected collectors of the transistors Q5 and Q7. Alternatively, logarithmic output current ($I_{LOG}'$) could be taken from the commonly connected collectors of the transistors Q6 and Q8. Still another alternative is to use both the logarithmic output currents ($I_{LOG}$) and ($I_{LOG}'$).

Although in the above described embodiments an area ratio (first area ratio) used in the buffer and bias generator 12 (e.g., N:1; FIG. 3) and an area ratio (second area ratio) used in the logarithmic detector cells 14 (e.g., M:1; FIG. 3), it should be recognized that the first area ratio can equal one or the second area ratio can equal one, but both the first and second area ratios cannot both equal one for the circuit to be useful in logarithmic detection. Also, note that the same basic operation of the logarithmic detector occurs when N=M=3 or when N=9 and M=1; however, in the later case the high-speed performance of the detector suffers.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications, and equivalents may be resorted to as falling within the scope of the invention.

What is claimed is:

1. A temperature compensated logarithmic detector, comprising:
   biasing circuitry for receiving an input signal having, and for producing a PTAT bias voltage from the input signal, the PTAT characteristic of the PTAT bias voltage being produced using a first area ratio; and
   a logarithmic detector cell, operatively connected to said biasing circuitry, for converting the input signal to a logarithmic output signal in accordance with a logarithmic transfer function.

2. A temperature compensated logarithmic detector as recited in claim 1, wherein the first area ratio is within said bias circuitry.

3. A temperature compensated logarithmic detector as recited in claim 1, wherein the first area ratio is within said logarithmic detector cell.

4. A temperature compensated logarithmic detector as recited in claim 1, wherein said logarithmic detector cell is a half-wave detector cell.

5. A temperature compensated logarithmic detector as recited in claim 1, wherein said logarithmic detector cell is a full-wave detector cell.

6. A temperature compensated logarithmic detector as recited in claim 1, wherein the first area ratio is an integer greater than one.

7. A temperature compensated logarithmic detector as recited in claim 1, wherein the input signal is an input voltage having a first polarity and a second polarity,
   wherein said biasing circuitry comprises:
      a first transistor with a first area, a base of the first transistor being coupled to the first polarity of the input voltage;
      a second transistor with a second area, a base of the second transistor being coupled to the second polarity of the input voltage, and
   wherein the ratio of the first area to the second area is the first area ratio.

8. A temperature compensated logarithmic detector as recited in claim 7, wherein said biasing circuitry further comprises:
   first and second current sources, the first and second current sources are substantially identical and are respectively coupled between the respective emitters of the first and second transistors and ground, and the collectors of the first and second transistors are coupled to a supply voltage.

9. A temperature compensated logarithmic detector as recited in claim 7, wherein said biasing circuitry further comprises:
   a third transistor with the second area, a base of the third transistor being coupled to the first polarity of the input voltage; and
   a fourth transistor with the first area, a base of the fourth transistor being coupled to the second polarity of the input voltage.

wherein the area ratio between the first and third transistors substantially equals the area ratio between the second and fourth transistors.

10. A temperature compensated logarithmic detector as recited in claim 8, wherein the bias voltage is produced between the emitters of the first and second transistors.

11. A temperature compensated logarithmic detector as recited in claim 10,
   wherein said logarithmic detector cell comprises:
      a first pair of transistors having bases respectively connected to the emitters of the first and second transistors, emitters commonly connected, and first and second collectors, and
   wherein the logarithmic output signal is obtained from at least one of the first and second collectors of the first pair of transistors.

12. A temperature compensated logarithmic detector as recited in claim 11, wherein said logarithmic detector cell further comprises a third current source coupled between the commonly connected emitters of the first pair of transistors and ground.

13. A temperature compensated logarithmic detector as recited in claim 11, wherein the first transistor of the first pair of transistors has a third area and the second transistor of the first pair of transistors has a fourth area, and wherein the ratio of the fourth area to the third area is a second area ratio.

14. A temperature compensated logarithmic detector as recited in claim 11, wherein the logarithmic transfer function for the input signal is inversely proportional to the first and second area ratios.

15. A temperature compensated logarithmic detector as recited in claim 1, wherein said biasing circuitry produces the PTAT bias voltage using a difference of base-emitter junction voltages of unequal sized transistors.

16. A temperature compensated logarithmic detector as recited in claim 1, wherein said biasing circuitry produces the PTAT bias voltage using a difference of base-emitter junction voltages, thereby eliminating the need for producing the PTAT bias voltage across resistors.

17. A temperature compensated logarithmic detector, comprising:
   a input terminal for receiving an input voltage, the input terminal having a first polarity side and a second polarity side;
   a first transistor with a first area, said first transistor having a base connected to the second polarity side, a collector connected to a first potential, and an emitter;
   a second transistor with a second area, said second transistor having a base connected to the first polarity side, a collector connected to the first potential, and an emitter;
   a first current source connected between the emitter of said first transistor and a second potential;
   a second current source connected between the emitter of said second transistor and the second potential;
   a third transistor having a base connected to the emitter of said second transistor, a collector, and an emitter;
   a fourth transistor having a base connected to the emitter of said first transistor, a collector, and an emitter connected to the emitter of said third transistor;
   a third current source connected between the commonly connected emitters of said third and fourth transistors and the second potential; and
   an output terminal for outputting an output logarithmic signal, said output terminal being connected to at least one of the collectors of said third and fourth transistors.

18. A temperature compensated logarithmic detector as recited in claim 17, wherein said first and second current sources are substantially identical, and wherein said third transistor has a third area and said fourth transistor has a fourth area which differs from the third area.

19. A temperature compensated logarithmic detector as recited in claim 17, wherein a bias voltage between the bases of said third and fourth transistors as well as between the emitters of said first and second transistors is determined in accordance with the ratio of the first area to the second area.

20. A temperature compensated logarithmic detector, comprising:

a input terminal for receiving an input voltage, the input terminal having a first polarity side and a second polarity side;

a first transistor with a first area, said first transistor having a base connected to the second polarity side, a collector connected to a first potential, and an emitter;

a second transistor with a second area which differs from the first area, said second transistor having a base connected to the second polarity side, a collector s connected to the first potential, and an emitter;

a third transistor with the first area, said third transistor having a base connected to the first polarity side, a collector connected to a first potential, and an emitter;

a fourth transistor with the second area, said fourth transistor having a base connected to the first polarity side, a collector connected to the first potential, and an emitter;

a first current source connected between the emitter of said first transistor and a second potential;

a second current source connected between the emitter of said second transistor and the second potential;

a third current source connected between the emitter of said third transistor and the second potential;

a fourth current source connected between the emitter of said fourth transistor and the second potential;

a fifth transistor having a base connected to the emitter of said fourth transistor, a collector, and an emitter;

a sixth transistor having a base connected to the emitter of said first transistor, a collector, and an emitter connected to the emitter of said fifth transistor;

a fifth current source connected between the commonly connected emitters of said fifth and sixth transistors and the second potential;

a seventh transistor having a base connected to the emitter of said second transistor, a collector connected to the collector of said fifth transistor, and an emitter;

an eighth transistor having a base connected to the emitter of said third transistor, a collector connected to the collector of said sixth transistor, and an emitter connected to the emitter of said seventh transistor;

a sixth current source connected between the commonly connected emitters of said seventh and eighth transistors and the second potential; and an output terminal for outputting an output logarithmic signal, said output terminal being connected to the commonly connected collectors of said fifth and seventh transistors or the commonly connected collectors of said sixth and eighth transistors.

21. A temperature compensated logarithmic detector as recited in claim 20, wherein said first through fourth current sources are substantially identical, said first and third transistors are substantially identical, and said second and fourth transistors are substantially identical.

22. A temperature compensated logarithmic detector as recited in claim 20, wherein said fifth and seventh transistors have a third area, and said sixth and eighth transistors have a fourth area which differs from the third area.

23. A temperature compensated logarithmic detector as recited in claim 20, wherein a bias voltage between the bases of said fifth and sixth transistors as well as between the bases of said seventh and eighth transistors is determined in accordance with the ratio of the first area to the second area.

24. A temperature compensated logarithmic detector as recited in claim 20, wherein said detector further comprises a differential amplifier having a differential input connected between the emitters of said first and third transistors.

25. A method for temperature compensating a logarithmic detector, the logarithmic detector including at least biasing circuitry and a logarithmic detector cell, the biasing circuitry and the logarithmic detector cell each including at least transistors, said method comprising:

(a) producing a bias voltage using a difference between base-emitter voltages of transistors;

(b) biasing certain transistors within the logarithmic detector cell in accordance with the bias voltage;

(c) receiving an input signal for logarithmic conversion; and (d) logarithmicly converting the input signal to a logarithmic output signal using the biasing circuitry and the logarithmic detector cell.

26. A method as recited in claim 25, wherein the bias voltage is proportional to absolute temperature (PTAT) due to the PTAT characteristics of the base-emitter voltages.

27. A method as recited in claim 25, wherein said biasing (b) of the certain transistors within the logarithmic detector cell is temperature independent.

* * * * *

UNITED STATES PATENT AND TRADEMARK OFFICE
CERTIFICATE OF CORRECTION

PATENT NO. : 5,677,561
DATED : October 14, 1997
INVENTOR(S) : Brent R. Jensen

It is certified that error appears in the above-identified patent and that said Letters Patent is hereby corrected as shown below:

Column 4, line 56, change "13" to --I3--
Column 4, line 56, change "14" to --I4--
Column 5, line 4, change "Q8" to --Q5--
Column 5, line 40, change "15" to --I5--
Column 5, line 40, change "16" to --I6--

Column 6, line 15, change "Q 1" to --Q1--
Column 6, line 19, change "13" to --I3--
Column 6, line 19, change "14" to --I4--
Column 6, line 36, change "1n" to --ln--
Column 6, line 41, change first and second occurrence of "1n" to --ln--
Column 6, line 42, change "1n(N)" to --ln(N)--
Column 7, line 55, change "1n" to --ln--
Column 7, line 57, change first, second, third, and fourth occurrence of "1n" to --ln--

UNITED STATES PATENT AND TRADEMARK OFFICE
CERTIFICATE OF CORRECTION

PATENT NO. : 5,677,561
DATED : October 14, 1997
INVENTOR(S) : Brent R. Jensen

It is certified that error appears in the above-identified patent and that said Letters Patent is hereby corrected as shown below:

continued...

Column 7, line 61, change first and second occurrence of "1n" to --ln--

Column 7, line 64, change "1n" to --ln--

Column 8, line 53, change "17" to --I7--

Column 9, line 9, change "16 dB" to --16dB--

Column 9, line 10, change "Iinearity" to --linearity--

Column 9, lines 58 and 59, change "80 dB" to --80dB--

Column 9, line 61, change "50 db" to --50dB--

Column 10, lines 33 and 34, change "(5 m on plot)" to --(5m on plot)--

Signed and Sealed this

Eighteenth Day of August, 1998

Attest:

BRUCE LEHMAN

*Attesting Officer*  *Commissioner of Patents and Trademarks*